United States Patent
Park et al.

(10) Patent No.: US 8,896,900 B2
(45) Date of Patent: Nov. 25, 2014

(54) ORGANIC LIGHT-EMITTING DISPLAY DEVICE

(75) Inventors: Soon-Ryong Park, Yongin (KR); Dae-Yup Shin, Yongin (KR); Hee-Seong Jeong, Yongin (KR); Sun-Hwa Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 359 days.

(21) Appl. No.: 13/367,430

(22) Filed: Feb. 7, 2012

(65) Prior Publication Data
US 2012/0224244 A1 Sep. 6, 2012

(30) Foreign Application Priority Data
Mar. 4, 2011 (KR) ........................ 10-2011-0019644

(51) Int. Cl.
*G02F 1/17* (2006.01)
*H01L 51/52* (2006.01)
*G02B 5/23* (2006.01)

(52) U.S. Cl.
CPC .............. *G02B 5/23* (2013.01); *H01L 51/5284* (2013.01); *H01L 51/5246* (2013.01)
USPC ....................................................... 359/242

(58) Field of Classification Search
CPC ........................................................ G02B 5/23
USPC ................................. 359/241, 242
See application file for complete search history.

(56) References Cited

U.S. PATENT DOCUMENTS

| 2010/0230648 | A1 | 9/2010 | Izumi et al. |
| 2011/0096504 | A1* | 4/2011 | Hild .............................. 361/704 |
| 2011/0291552 | A1 | 12/2011 | Kwon et al. |

FOREIGN PATENT DOCUMENTS

| EP | 1 978 022 A1 | 10/2008 | |
| KR | 10-2004-0052364 | 6/2004 | |
| KR | 10-2008-0091349 A | 10/2008 | |
| KR | 10-2009-0081863 A | 7/2009 | |
| KR | 10-2009-0089210 | 8/2009 | |
| KR | 10-2011-0131807 A | 12/2011 | |
| WO | WO2009021741 A2 * | 2/2009 | .............. H01L 51/52 |

OTHER PUBLICATIONS

Holm AK et al., "Femtosecond UV/mid-IR study of photocheromism of the spiropyran 1',3'-dihydro-1'3',3'-trimethyl-6-nitrospiro-[2H-1-benzopyran-2,2'-(2H)-indole] in solution", Chemical Physics Letters, vol. 376, No. 1-2, 214-219, 2003.

* cited by examiner

*Primary Examiner* — Joseph P Martinez
(74) *Attorney, Agent, or Firm* — Robert E. Bushnell, Esq.

(57) ABSTRACT

An organic light-emitting display device including: a first substrate; a second substrate disposed to face the first substrate; a display unit interposed between the first substrate and the second substrate and comprising an organic light-emitting device; a sealing member disposed to surround the display unit between the first substrate and the second substrate and that bonds the first substrate to the second substrate; and a filler disposed in the sealing member to cover the display unit and comprising photochromic materials, wherein the photochromic materials comprise a first photochromic material that absorbs light in a wavelength of about 470 nm to about 490 nm and a second photochromic material that absorbs light in a wavelength of about 550 nm to about 580 nm.

19 Claims, 4 Drawing Sheets

ORGANIC LIGHT-EMITTING DISPLAY DEVICE

CROSS-REFERENCE TO RELATED PATENT APPLICATION

This application claims the benefit of Korean Patent Application No. 10-2011-0019644, filed on Mar. 4, 2011, in the Korean Intellectual Property Office, the disclosure of which is incorporated herein in its entirety by reference.

BACKGROUND OF THE INVENTION

1. Field of the Invention

The present invention relates to an organic light-emitting display device, and more particularly, to an organic light-emitting display device having improved visibility.

2. Description of the Related Art

Organic light-emitting display devices are flat display devices in which an organic emission layer is interposed between electrodes that face each other, electros injected from one electrode and holes injected from the other electrode are bonded to each other at the organic emission layer, and energy emitted while luminescent molecules of the organic emission layer are excited through the bond and then return to a ground state is emitted as light.

Such an organic light-emitting display device may have excellent visibility, be easily made to be light in weight and thin, and be driven at a low driving voltage and thus has been highlighted as a next generation display device.

When there is air between a window and a panel in the organic light-emitting display device, a reflection amount increases and thus visibility is poor outdoors. In this regard, a gap between the window and the panel is filled with epoxy to improve visibility; however, visibility is still poor.

SUMMARY OF THE INVENTION

The present invention provides an organic light-emitting display device having improved visibility.

According to an aspect of the present invention, there is provided an organic light-emitting display device including: a first substrate; a second substrate disposed to face the first substrate; a display unit interposed between the first substrate and the second substrate and including organic light-emitting devices; a sealing member disposed to surround the display unit between the first substrate and the second substrate and that bonds the first substrate to the second substrate; and a filler disposed in a space defined by the first and second substrates and the sealing member to cover the display unit and including photochromic materials, wherein the photochromic materials include a first photochromic material that absorbs light in a wavelength of about 470 nm to about 490 nm and a second photochromic material that absorbs light in a wavelength of about 550 nm to about 580 nm.

The photochromic material may include a compound represented by Formula 1 below:

[Formula 1]

wherein $R_1$, $R_2$, $R_3$, $R_4$, $R_5$, and $R_6$ are each independently hydrogen, heavy hydrogen, or halogen, and $Ar_1$ and $Ar_2$ are each independently a group below;

Y represents O, S, SO, or $SO_2$;
X represents C or N;
* represents a bond;
$R_8$ represents a $C_1$ to $C_{50}$ alkyl group or a $C_5$ to $C_{60}$ aryl group; and
$R_7$ and $R_9$ are each independently an unshared electron pair, hydrogen, heavy hydrogen, or a $C_1$ to $C_{50}$ alkyl group.

The photochromic material may include a compound represented by Formula 2 below:

[Formula 2]

wherein $R_1$, $R_2$, $R_3$, $R_4$, $R_5$, and $R_6$ are each independently hydrogen, heavy hydrogen, or halogen, X represents C or N; $R_8$ represents a $C_1$ to $C_{10}$ alkyl group or a $C_6$ to $C_{30}$ aryl group; and $R_7$ and $R_9$ are each independently an unshared electron pair, hydrogen, heavy hydrogen, or a $C_1$ to $C_{10}$ alkyl group.

The first photochromic material may include a compound represented by Formula 3 below; and

[Formula 3]

The second photochromic material may be a compound represented by Formula 4 below:

[Formula 4]

In the above Formulae, $R_8$ represents a $C_1$ to $C_{10}$ alkyl group or a $C_5$ to $C_{30}$ aryl group; and $R_9$ represents hydrogen, heavy hydrogen, or a $C_1$ to $C_{10}$ alkyl group.

The first photochromic material may include a compound represented by Formula 5 below;

[Formula 5]

The second photochromic material may be a compound represented by Formula 6 below:

[Formula 6]

A ratio of the first photochromic material and the second photochromic material may be a molar ratio of 1:2 to 2:1.

The filler may include a binder.

The filler may include an epoxy binder.

An amount of the photochromic material of the filler may be in the range of about 50 to about 70 parts by weight based on 100 parts by weight of the filler.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

An organic light-emitting display device according to an embodiment of the present invention includes: a first substrate; a second substrate disposed to face the first substrate; a display unit interposed between the first substrate and the second substrate and including an organic light-emitting device; a sealing member disposed to surround the display unit between the first substrate and the second substrate and that bonds the first substrate to the second substrate; and a filler disposed in a space defined by the first and second substrates and the sealing member to cover the display unit and including photochromic materials, wherein the photochromic materials include a first photochromic material that absorbs light in a wavelength of about 470 nm to about 490 nm and a second photochromic material that absorbs light in a wavelength of about 550 nm to about 580 nm.

Figure 1:
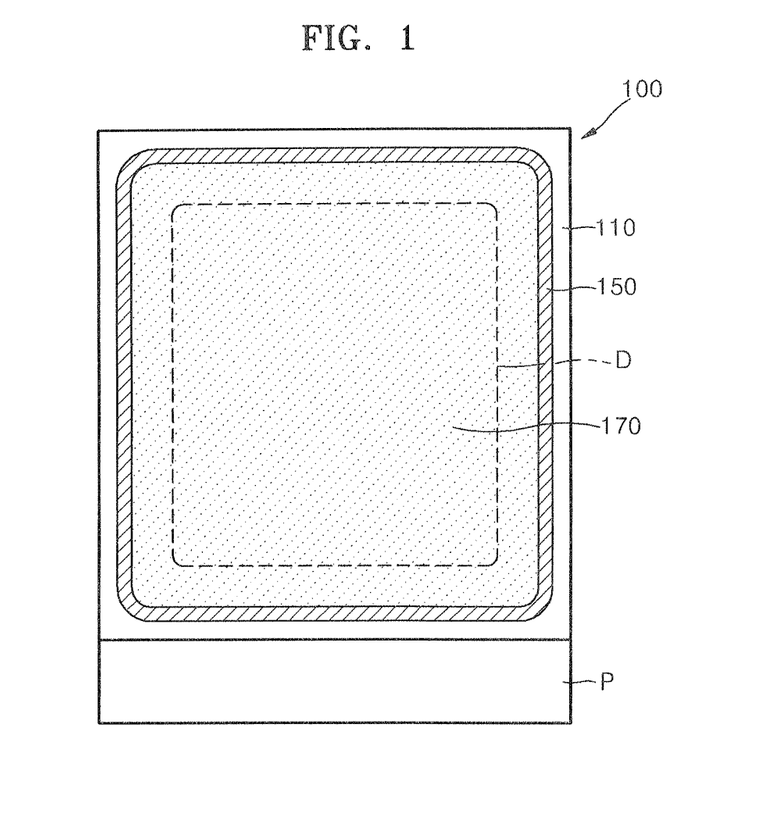
FIG. 1 is a plan view schematically illustrating a part of an organic light-emitting display device according to an embodiment of the present invention.
Figure 2:
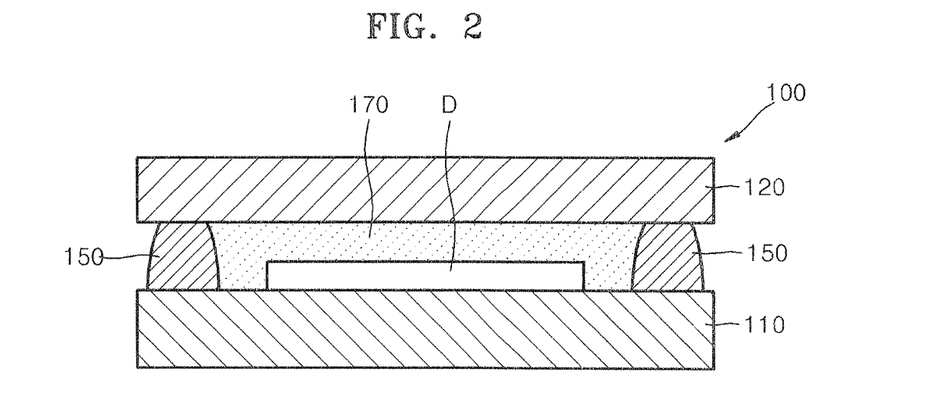
FIG. 2 is a cross-sectional view schematically illustrating an organic light-emitting display device in which a second substrate is bonded to a first substrate.
Figure 3:
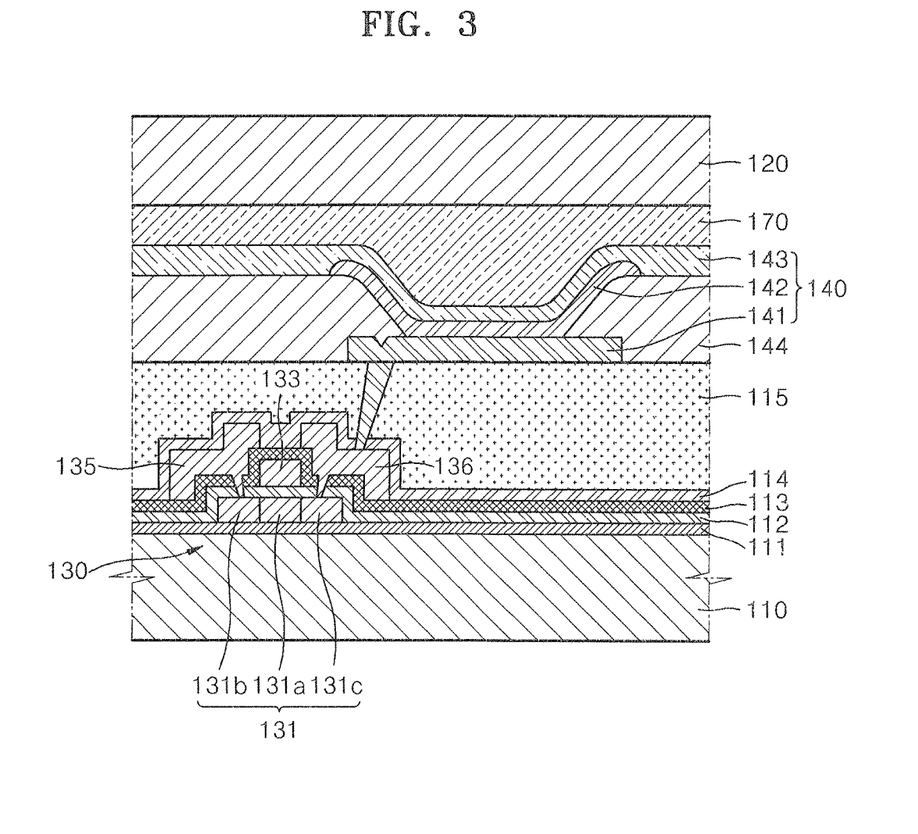
FIG. 3 is a cross-sectional view of a display unit of FIGS. 1 and 2 in detail.

FIG. 1 is a plan view schematically illustrating a part of an organic light-emitting display device 100 according to an embodiment of the present invention, FIG. 2 is a cross-sectional view schematically illustrating the organic light-emitting display device 100 in which a second substrate 120 is bonded to a first substrate 110, and FIG. 3 is a cross-sectional view of a display unit D of FIGS. 1 and 2 in detail.

Referring to FIGS. 1 through 3, the organic light-emitting display device 100 according to the current embodiment of the present invention includes a first substrate 110, the second substrate 120, a sealing member 150, and a filler 170 including photochromic materials.

The display unit D and a pad unit P are formed on a surface of the first substrate 110 that faces the second substrate 120, and the sealing member 150 is disposed at a distance from an outer wall of the display unit D to surround the display unit D.

The display unit D includes a plurality of organic light-emitting devices (OLEDs) 140 and a plurality of thin film transistors (TFTs) 130 respectively connected to the plurality of OLEDs 140. The organic light-emitting display device 100 may be divided into a passive matrix (PM) type and an active matrix (AM) type according to whether each OLED 140 is controlled by the TFT 130. The organic light-emitting display device 100 may be applied to any of the PM type and the AM type display devices. Hereinafter, the organic light-emitting display device 100 of a PM type will be described in detail.

The first substrate 110 and the second substrate 120 may each be a transparent glass substrate mainly including $SiO_2$; however, the present invention is not limited thereto. The first substrate 110 and the second substrate 120 may each be a substrate including various materials including plastic.

An active layer 131 of the TFT 130 is formed on a buffer layer 111 by using a semiconductor material, and a gate insulation layer 112 is formed to cover the active layer 131. The active layer 131 may include an inorganic semiconductor or an organic semiconductor such as amorphous silicon or polysilicon, and may include a source region 131b, a drain region 131c, and a channel region 131a interposed between the source region 131b and the drain region 131c.

A gate electrode 133 is formed on the gate insulation layer 112, and an interlayer insulation layer 113 is formed to cover the gate electrode 133. A source electrode 135 and a drain electrode 136 are formed on the interlayer insulation layer 113, and a passivation film 114 and a planarization film 115 are sequentially formed on the source electrode 135 and the drain electrode 136.

The gate insulation layer 112, the interlayer insulation layer 113, the passivation film 114, and the planarization film 115 may each include an insulation material and may be formed to have a single-layered or multi-layered structure using an inorganic material, an organic material, or an organic/inorganic complex. A TFT stack structure described above is an example, and TFTs having various structures may be applied.

The pad unit P is formed at the outer wall of the display unit D. The pad unit P includes a plurality of pad electrodes (not illustrated), wherein the pad electrodes (not illustrated) are connected to correspond to various wirings (not illustrated) for driving display devices included in the display unit D, for example, data lines, scan lines, or power supply lines and thus transmit external signals to the OLEDs 140 included in the display unit D through the wirings.

A first electrode 141, as an anode of the OLED 140, is formed on the planarization film 115, and a pixel-defining layer 144, including an insulation material, is formed to cover the first electrode 141. A predetermined opening is formed in the pixel-defining layer 144 and then an organic emission layer 142 of the OLED 140 is formed in a region defined by the opening. Also, a second electrode 143, as a cathode of the OLED 140, is formed to cover all pixels. Polarities of the first electrode 141 and the second electrode 143 may be opposite to the ones described above.

The first electrode 141 may be a transparent electrode or a reflective electrode. When the first electrode 141 is a transparent electrode, the first electrode 141 may include ITO, IZO, ZnO, or $In_2O_3$. When the first electrode 141 is a reflective electrode, the first electrode 141 may include a reflective film formed of Ag, Mg, Al, Pt, Pd, Au, Ni, Nd, Ir, Cr, or a compound thereof, or a transparent film formed of ITO, IZO, ZnO, or $In_2O_3$.

The second electrode 143 may be also a transparent electrode or a reflective electrode. When the second electrode 143 is a transparent electrode, the second electrode 143 may include a film formed by depositing Li, Ca, LiF/Ca, LiF/Al, Al, Mg, or a compound thereof so as to face the organic emission layer 142 and an auxiliary electrode or a bus electrode line, including a transparent conductive material such as ITO, IZO, ZnO, or $In_2O_3$, formed on the film. When the second electrode 143 is a reflective electrode, the second electrode 143 may include Li, Ca, LiF/Ca, LiF/Al, Al, Mg, or a compound thereof.

The organic emission layer 142 interposed between the first electrode 141 and the second electrode 143 may include a low molecular or polymer organic material.

The organic emission layer 142 is now described more fully. The organic emission layer 142 may include one or more of a hole injection layer (HIL), a hole transport layer (HTL), an emission layer (EML), a hole blocking layer (HBL), an electron transport layer (ETL), and an electron injection layer (EIL).

The HIL (not illustrated) may be formed on the first electrode 141 by using various methods such as vacuum deposition, spin coating, casting, or Langmuir-Blodgett (LB).

When the HIL is formed by using vacuum deposition, a deposition condition may vary according to a compound used as a material for forming the HIL, a desired structure of the HIL, and a thermal characteristic. However, in general, the deposition condition may be appropriately selected from deposition temperature of about 100 to about 500° C., the degree of vacuum of about $10^{-8}$ to about $10^{-3}$ torr, and deposition speed of 0.01 to about 100 Å/sec.

When the HIL is formed by using spin coating, a coating condition may vary according to a compound used as a material for forming the HIL, a desired structure of the HIL, and a thermal characteristic. However, the coating condition may be appropriately selected from a coating speed of about 2,000 rpm to about 5,000 rpm and a thermal treatment temperature for removing a solvent after coating of about 80° C. to about 200° C.

The material for forming the HIL may include a well-known hole injection material, for example, a phthalocyanine compound such as copper phthalocyanine, m-MTDATA [4,4',4''-tris(3-methylphenylphenylamino)triphenylamine], N,N'-di(1-naphthyl)-N,N'-diphenylbenzidine (NPB), TDATA, 2T-NATA, Polyaniline/Dodecylbenzenesulfonic acid (Pani/DBSA), Poly(3,4-ethylenedioxythiophene)/Poly (4-styrenesulfonate) (PEDOT/PSS), Polyaniline/Camphor sulfonic acid (Pani/CSA) or Polyaniline/Poly(4-styrenesulfonate) (PANI/PSS).

m-MTDATA

TDATA

-continued

2T-NATA

A thickness of the HIL may be about 100 Å to about 10,000 Å, for example, about 100 Å to about 1,000 Å. When the thickness of the HIL is in the above range, an excellent hole injection characteristic may be obtained without an increase in a driving voltage.

Then, the HTL (not illustrated) may be formed on the HIL by using various methods such as vacuum deposition, spin coating, casting, or LB.

When the HTL is formed by using vacuum deposition or spin coating, a deposition condition or a coating condition may vary according to a used compound; however, may be generally selected from the same condition for forming the HIL.

The material for forming the HTL may include a well-known hole transport material, for example, a carbazole derivative such as N-phenylcarbazole or polyvinylcarbazole, NPB, or an amine derivative having an aromatic fused ring such as N,N'-bis(3-methylphenyl)-N,N'-diphenyl-[1,1-biphenyl]-4,4'-diamine (TPD).

TPD

NPB

A thickness of the HTL may be about 50 Å to about 1,000 Å, for example, about 100 Å to about 600 Å. When the thickness of the HTL is in the above range, an excellent hole transport characteristic may be obtained without an increase in a driving voltage.

Then, the EML (not illustrated) may be formed on the HTL by using various methods such as vacuum deposition, spin coating, casting, or LB.

When the EML is formed by using vacuum deposition or spin coating, a deposition condition or a coating condition may vary according to a used compound; however, may be generally selected from the same condition for forming the HIL.

The material for forming the EML may include various well-known emission materials, for example, a well-known host and dopant. The dopant may be both a well-known fluorescent dopant and a well-known phosphorescent dopant.

For example, the well-known host may include $Alq_3$, CBP (4,4'-N,N'-dicarbazole-biphenyl), poly(n-vinylcarbazole) (PVK), 9,10-di(naphthalen-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, or distyrylarylene (DSA); however, the present invention is not limited thereto.

TPBI

TBADN

E3

PVK

A well-known red dopant may include PtOEP, Ir(piq)$_3$, Btp$_2$Ir(acac), or DCJTB; however, the present invention is not limited thereto.

Ir(ppy)$_3$

PtOEP

Ir(ppy)$_2$(acac)

Ir(piq)$_3$

Ir(mpyp)$_3$

Btp$_2$Ir(acac)

C545T

A well-known green dopant may include Ir(ppy)$_3$ (ppy=phenylpyridine), Ir(ppy)$_2$(acac), Ir(mpyp)$_3$, or C545T; however, the present invention is not limited thereto.

A well-known blue dopant may include F2Irpic, (F2 ppy)2Ir(tmd), Ir(dfppz)$_3$, ter-fluorene, 4,4'-bis(4-diphenylaminostyryl)biphenyl (DPAVBi), or 2,5,8,11-tetra-t-butyl perylene (TBP); however, the present invention is not limited thereto.

An amount of the dopant may be in the range of about 0.1 to about 20 parts by weight, in particular, about 0.5 to about 12 parts by weight, based on 100 parts by weight of the material for forming the EML (that is, the total weight of the host and dopant is 100 parts by weight). When the amount of the dopant is in the above range, concentration quenching may be substantially prevented.

A thickness of the EML may be in the range of about 100 Å to about 1,000 Å, for example, about 200 Å to about 600 Å. When the thickness of the EML is in the above range, an excellent emission characteristic may be obtained without an increase in a driving voltage.

When the EML includes a phosphorescent dopant, the HBL (not illustrated) may be formed on the EML in order to prevent triplet excitons or holes from being diffused into the ETL. A material for forming the HBL is not particularly limited and may include any well-known hole blocking material, for example, an oxadiazole derivative, a triazole derivative, a phenanthroline derivative, Balq, or BCP.

A thickness of the HBL may be in the range of about 50 Å to about 1,000 Å, for example, about 100 Å to about 300 Å. When the thickness of the HBL is below 50 Å, a hole blocking characteristic may deteriorate, and when the thickness of the HBL is above 1,000 Å, a driving voltage may increase.

Then, the ETL (not illustrated) may be formed on the HBL by using various methods such as vacuum deposition, spin coating, or casting.

When the ETL is formed by using vacuum deposition or spin coating, a deposition condition or a coating condition may vary according to a used compound; however, may be generally selected from the same condition for forming the HIL.

The material for forming the ETL may include any well-known electron transport material, for example, a quinoline derivative, in particular, tris(8-quinolinolato)aluminum ($Alq_3$), TAZ, or BAlq; however, the present invention is not limited thereto.

A thickness of the ETL may be in the range of about 100 Å to about 1,000 Å, for example, about 100 Å to about 500 Å. When the thickness of the ETL is in the range of about 100 Å to about 1,000 Å, an excellent electron transport characteristic may be obtained without an increase in a driving voltage.

Also, the EIL (not illustrated), which facilitates injection of electrons from a negative electrode, may be formed on the ETL.

A material for forming the EIL may include any well-known electron injection material such as LiF, NaCl, CsF, $Li_2O$, or BaO. A deposition condition or a coating condition of the EIL may vary according to a used compound; however, may be generally selected from the same condition for forming the HIL.

A thickness of the EIL may be in the range of about 1 Å to about 100 Å, for example, about 5 Å to about 90 Å. When the thickness of the EIL is in the range of about 1 Å to about 100 Å, an excellent electron injection characteristic may be obtained without an increase in a driving voltage.

The photochromic materials included in the filler of the organic light-emitting display device according to the embodiment of the present invention may include the first photochromic material that absorbs light in a wavelength of about 470 nm to about 490 nm and the second photochromic material that absorbs light in a wavelength of about 550 nm to about 580 nm. For example, the wavelength of light absorbed by the first photochromic material is in the range of about 480 nm to about 490 nm, and the wavelength of light absorbed by the second photochromic material is in the range of about 560 nm to about 580 nm.

When the wavelength of light absorbed by the photochromic materials included in the filler is in the above range, the wavelength is less overlapped by the wavelength of light emitted from the EML. Accordingly, light emitted from the EML is not absorbed by the photochromic materials, and the photochromic materials according to the embodiment of the present invention only absorb external light and thus visibility may be improved.

Figure 4:
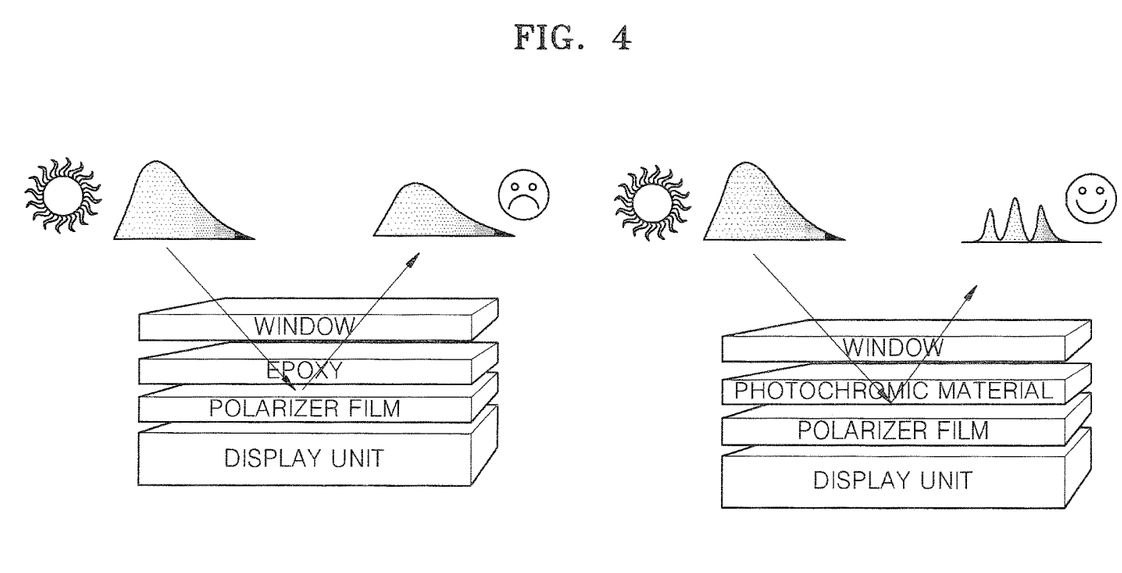
FIG. 4 is a diagram schematically illustrating comparison between a case when photochromic materials are not used and a case when photochromic materials are used in a filler so that the photochromic materials absorb light.
Figure 5:
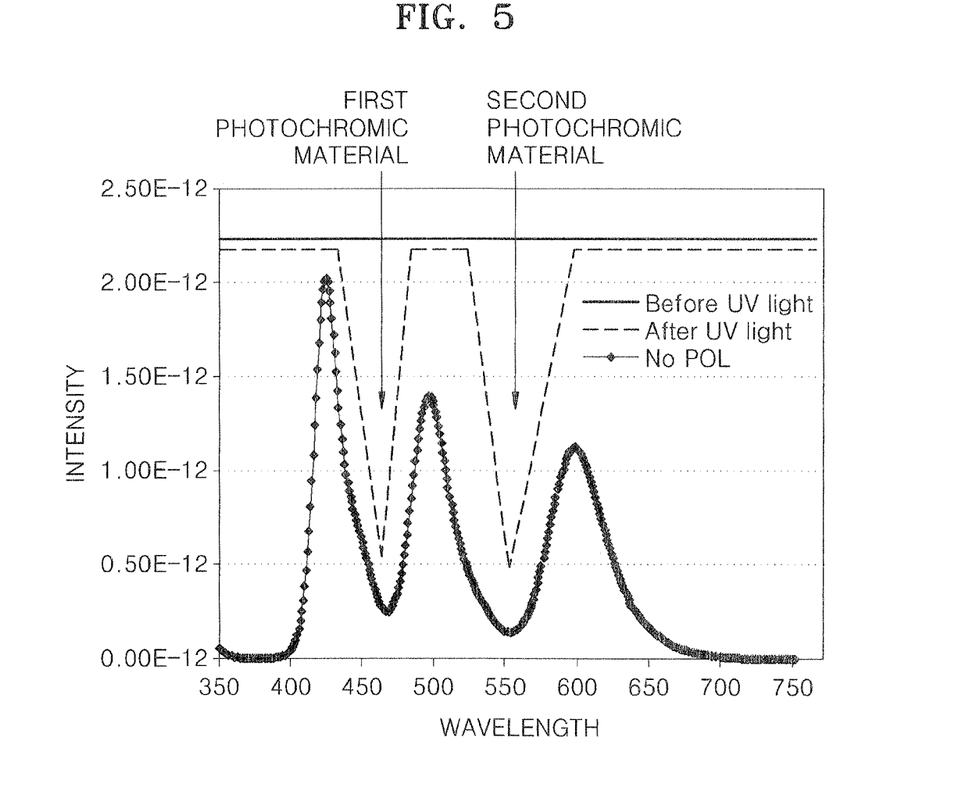
FIG. 5 is a graph showing a wavelength range that photochromic materials included in a filler absorb light.

FIG. 4 is a diagram schematically illustrating that the left organic light-emitting display device in which a filler is formed of only epoxy, and the right organic light-emitting display device in which a filler is formed of the first and second photochromic materials; and FIG. 5 is a graph showing a wavelength range that the photochromic materials included in the filler absorb light.

Referring to FIGS. 4 and 5, a general organic light-emitting display device (i.e., the left organic light-emitting display device in FIG. 4), including a filler formed of only epoxy, does not absorb external light and thus visibility is decreased, whereas in the organic light-emitting display device (i.e., the right organic light-emitting display device in FIG. 4) according to the embodiment of the present invention, the first photochromic material and the second photochromic material both included in the filler absorb external light in a wavelength of about 470 nm to about 490 nm and external light in a wavelength of about 550 nm to about 580 nm, respectively and thus visibility is increased.

The photochromic material according to the embodiment of the present invention may be a compound represented by Formula 1 below:

[Formula 1]

wherein $R_1$, $R_2$, $R_3$, $R_4$, $R_5$, and $R_6$ are each independently hydrogen, heavy hydrogen, or halogen, and $Ar_1$ and $Ar_2$ are each independently a group below;

Y represents O, S, SO, or $SO_2$; X represents C or N; * represents a bond; $R_8$ represents a $C_1$ to $C_{50}$ alkyl group or a $C_5$ to $C_{60}$ aryl group; and $R_7$ and $R_9$ are each independently an unshared electron pair, hydrogen, heavy hydrogen, or a $C_1$ to $C_{50}$ alkyl group.

More specifically, the photochromic material may be a compound represented by Formula 2 below:

[Formula 2]

wherein $R_1$, $R_2$, $R_3$, $R_4$, $R_5$, and $R_6$ are each independently hydrogen, heavy hydrogen, or halogen, X represents C or N; $R_8$ represents a $C_1$ to $C_{10}$ alkyl group or a $C_5$ to $C_{30}$ aryl group; and $R_7$ and $R_9$ are each independently an unshared electron pair, hydrogen, heavy hydrogen, or a $C_1$ to $C_{10}$ alkyl group.

The compound represented by Formula 2 may absorb UV light and may be transformed as shown below. When the compound represented by Formula 2 absorbs energy such as heat, the compound may return to its original form.

More specifically, the first photochromic material may be a compound represented by Formula 3 below:

[Formula 3]

The second photochromic material may be a compound represented by Formula 4 below:

[Formula 4]

In the above Formulae, $R_8$ represents a $C_1$ to $C_{10}$ alkyl group or a $C_5$ to $C_{30}$ aryl group; and $R_9$ represents hydrogen, heavy hydrogen, or a $C_1$ to $C_{10}$ alkyl group.

According to another embodiment of the present invention, first photochromic material may be a compound represented by Formula 5 below:

[Formula 5]

The second photochromic material may be a compound represented by Formula 6 below:

[Formula 6]

The compound represented by Formula 5 may absorb UV and may be transformed as shown below. When the compound represented by Formula 5 absorbs energy such as heat, the compound may return to its original form. The compound before absorbing UV is a conjugated compound and thus may absorb visible light in a predetermined region. However, even if the compound is the conjugated compound, when a molecule does not exist on a single plane, visible light absorption capability decreases. In particular, inside methyl groups of thoiphene moiety of the compound represented by Formula 5 are close to each other so as to cause steric hindrance, and thus there is a low possibility that the compound exists on a single plane before the compound represented by Formula 5 absorbs UV. When the compound represented by Formula 5 absorbs UV and forms a bond, a compound transformed by absorbing UV is a conjugated compound; however, the compound nearly exists on a single plane so that the absorption capability of light in a wavelength of about 470 nm to about 490 nm significantly increases.

The compound represented by Formula 6 may absorb UV and may be transformed as shown below. When the compound represented by Formula 6 absorbs energy such as heat, the compound may return to its original form. Also, the compound before absorbing UV is a conjugated compound and thus may absorb visible light in a predetermined region. However, even if the compound is the conjugated compound, when a molecule does not exist on a single plane, visible light absorption capability decreases. In particular, inside methyl groups of thoiphene moiety of the compound represented by Formula 6 are close to each other so as to cause steric hindrance and thus there is a low possibility that the compound represented by Formula 6 exists on a single plane before the compound represented by Formula 6 absorbs UV. When the compound represented by Formula 6 absorbs UV and forms a bond, a compound transformed by absorbing UV is a conjugated compound; however, the compound nearly exists on a single plane so that the absorption capability of light in a wavelength of about 550 nm to about 580 nm significantly increases.

Hereinafter, the representative groups used in the Formulae of the present invention may be defined as follows (the number of carbons that define a substituent is not limited and do not limit characteristics of the substituent).

In the Formulae, an unsubstituted $C_1$ to $C_{50}$ alkyl group may be linear or branched, and may include, but is not limited to, methyl, ethyl, propyl, isobutyl, sec-butyl, pentyl, isoamyl, hexyl, heptyl, octyle, nonanyl, or dodecyl. At least one hydrogen atom in the alkyl group may be substituted to a heavy hydrogen atom, a halogen atom, a hydroxyl group, a nitro group, a cyano group, an amino group, an amidino group, hydrazine, hydrazone, a carboxyl group or salts thereof, a sulfonate group or salts thereof, a phosphoric acid or salts thereof, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, a $C_6$ to $C_{16}$ aryl group, or a $C_4$ to $C_{16}$ heteroaryl group.

In the Formulae, an unsubstituted $C_5$ to $C_{60}$ aryl group denotes a carbocycle aromatic system including at least one ring. When the carbocycle aromatic system includes at least two rings, the rings may be fused to each other or may be connected through a single bond. The term "aryl" includes an aromatic system such as phenyl, naphthyl, or anthracenyl. Also, at least one hydrogen atom in the aryl group may be substituted to the same substituent as a substituent of the $C_1$ to $C_{50}$ alkyl group.

Examples of a substituted or unsubstituted $C_5$ to $C_{60}$ aryl group may include a phenyl group, a $C_1$ to $C_{10}$ alkylphenyl group (for example, an ethylphenyl group), a halophenyl group (for example, an o-, m-, and p-fluorophenyl group, dichlorophenyl group), a cyanophenyl group, a dicyanophenyl group, a trifluoromethoxyphenyl group, a biphenyl group, a halobiphenyl group, a cyanobiphenyl group, a $C_1$ to $C_{10}$ alkylbiphenyl group, a $C_1$ to $C_{10}$ alkoxybipheynl group, an o-, m-, and p-tolyl group, an o-, m- and p-cumenyl group, a mesityl group, a phenoxyphenyl group, an (α,α-dimethylbenzene) phenyl group, an (N,N'-dimethyl)aminophenyl group, (N,N'-diphenyl)aminophenyl group, a pentalenyl group, an indenyl group, a naphthyl group, a halonaphthyl group (for example, a fluoronaphthyl group), a $C_1$ to $C_{10}$ alkylnaphthyl group (for example, a methylnaphthyl group), a $C_1$ to $C_{10}$ alkoxynaphthyl group (for example, a methoxynaphthyl group), a cyanonaphthyl group, an anthracenyl group, an azurenyl group, a heptarenyl group, an acenaphthylrenyl group, a phenalenyl group, a fluorenyl group, an anthraquinolyl group, a methyl anthryl group, a phenanthrenyl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, or an ovalenyl group.

A ratio of the first photochromic material and the second photochromic material may be a molar ratio of 1:2 to 2:1.

In the above molar ratio range, the absorption of light in a wavelength of about 470 nm to about 490 nm and light in a wavelength of about 550 nm to about 580 nm is excellent.

The filler may include a binder. Examples of the binder may include an organic binder and an inorganic binder. The binder may be, for example, an epoxy binder.

An amount of the photochromic material of the filler may be in the range of about 50 to about 70 parts by weight based on 100 parts by weight of the filler.

When the amount of the photochromic material is in the above range, the absorption of light in a wavelength of about 470 nm to about 490 nm and light in a wavelength of about 550 nm to about 580 nm is excellent.

Hereinafter, Examples of the present invention will be described in detail. The present invention, however, is not limited to the Examples below.

EXAMPLES

Example 1

A transparent electrode substrate coated with indium-tin oxide (ITO) in a thickness of about 1.0 μm as a first electrode layer on a transparent glass substrate (first substrate) was washed using acetone and an air gun, and then LiF was plasma deposited on the washed transparent electrode substrate as an insulation layer in a thickness of about 1.0 nm. Then, 4,4'-bis(N,N-phenyl-m-triamino)diphenylamine (TPD), as a HTL, was coated in a thickness of about 50 nm, and tris(8-quinolino aluminium) (Alq$_3$), as an EML, was coated in a thickness of about 50 nm. Then, Al was deposited to form a second electrode layer.

Frit was used to apply to the outer wall of the transparent glass substrate as a sealing member and a filler obtained by mixing epoxy, a compound represented by Formula 5 below, and a compound represented by Formula 6 below in the ratio of 1:1:1 was filled and a window (second substrate) was covered to press, thereby completing manufacture of an organic light-emitting display device.

[Formula 5]

-continued

[Formula 6]

Comparative Example 1

An organic light-emitting display device was manufactured in the same manner as in Example 1, except that only epoxy was used as a filler.

Reflectivities of the organic light-emitting display devices manufactured according to Example 1 and Comparative Example 1 were measured and results are shown in Table 1 below.

TABLE 1

|  | Desired Luminance | Luminance (cd/m^2) | ACR @ 500 lux | ACR @ 10,000 lux | Gamut @ 500 lux | Gamut @ 10,000 lux @ 500 lux | Reflectivity |
|---|---|---|---|---|---|---|---|
| Comparative | 200 | 187 | 16.9 | 1.55 | 82.1% | 3.5% | 10.3% |
| Example | 250 | 233 | 20.77 | 1.7 | 86.5% | 4.9% | |
|  | 300 | 278 | 24.18 | 1.82 | 90.7% | 6.6% | |
| Example | 200 | 206 | 42.9 | 2.45 | 101.1% | 14.5% | 4.35% |
|  | 250 | 253 | 52.23 | 2.78 | 103.2% | 18.1% | |
|  | 300 | 306 | 62.43 | 3.13 | 105.2% | 22.5% | |

ACR @ 500 lux and ACR @ 10,000 lux indicate values representing white luminance/black luminance of a display under intensity of illumination of 500 lux (fluorescent lamp environment intensity) and 10,000 lux external light environments. If the value increases, external light visibility is excellent.

Gamut indicates a color reproduction range and, if a value of Gamut increases, a color reproduction range is excellent.

Referring to Table 1, reflectivity of Example 1 is 4.35%, which is lower than reflectivity of Comparative Example 1, which is 10.3%.

The organic light-emitting display device according to the embodiments of the present invention has excellent visibility outdoors.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
a first substrate;
a second substrate disposed to face the first substrate;
a display unit interposed between the first substrate and the second substrate and comprising an organic light-emitting device;
a sealing member disposed to surround the display unit between the first substrate and the second substrate and that bonds the first substrate to the second substrate; and
a filler disposed in a space defined by the first and second substrates and the sealing member to cover the display unit and comprising photochromic materials, wherein
the photochromic materials comprising a first photochromic material that absorbs light in a wavelength of about 470 nm to about 490 nm and a second photochromic material that absorbs light in a wavelength of about 550 nm to about 580 nm; and
each of the first and second photochromic materials independently comprises a compound represented by Formula 1 below:

[Formula 1]

wherein $R_1$, $R_2$, $R_3$, $R_4$, $R_5$, and $R_6$ are each independently hydrogen, heavy hydrogen, or halogen, and $Ar_1$ and $Ar_2$ are each independently a group below:

Y represents O, S, SO, or $SO_2$;

X represents C or N;

* represents a bond;

$R_8$ represents a $C_1$ to $C_{50}$ alkyl group or a $C_5$ to $C_{60}$ aryl group; and $R_7$ and $R_9$ are each independently an unshared electron pair, hydrogen, heavy hydrogen, or a $C_1$ to $C_{50}$ alkyl group.

2. The organic light-emitting display device of claim 1, wherein each of the first and second photochromic material comprises independently a compound represented by Formula 2 below:

[Formula 2]

wherein $R_1$, $R_2$, $R_3$, $R_4$, $R_5$, and $R_6$ are each independently hydrogen, heavy hydrogen, or halogen,

X represents C or N;

$R_8$ represents a $C_1$ to $C_{10}$ alkyl group or a $C_6$ to $C_{30}$ aryl group; and $R_7$ and $R_9$ are each independently an unshared electron pair, hydrogen, heavy hydrogen, or a $C_1$ to $C_{10}$ alkyl group.

3. The organic light-emitting display device of claim 1, wherein the first photochromic material comprises a compound represented by Formula 3:

[Formula 3]

in the above Formula, $R_8$ represents a $C_1$ to $C_{10}$ alkyl group or a $C_5$ to $C_{30}$ aryl group; and $R_9$ represents hydrogen, heavy hydrogen, or a $C_1$ to $C_{10}$ alkyl group.

4. The organic light-emitting display device of claim 1, wherein the second photochromic material comprises a compound represented by Formula 4:

[Formula 4]

in the above Formula, $R_8$ represents a $C_1$ to $C_{10}$ alkyl group or a $C_5$ to $C_{30}$ aryl group; and $R_9$ represents hydrogen, heavy hydrogen, or a $C_1$ to $C_{10}$ alkyl group.

5. The organic light-emitting display device of claim 1, wherein the first photochromic material comprises a compound represented by Formula 3 below; and the second photochromic material comprises a compound represented by Formula 4 below:

[Formula 3]

[Formula 4]

in the above Formulae, $R_8$ represents a $C_1$ to $C_{10}$ alkyl group or a $C_5$ to $C_{30}$ aryl group; and $R_9$ represents hydrogen, heavy hydrogen, or a $C_1$ to $C_{10}$ alkyl group.

6. The organic light-emitting display device of claim 1, wherein the first photochromic material comprises a compound represented by Formula 5:

[Formula 5]

7. The organic light-emitting display device of claim 1, wherein the second photochromic material comprises a compound represented by Formula 6:

[Formula 6]

8. The organic light-emitting display device of claim 1, wherein the first photochromic material comprises a compound represented by Formula 5 below; and the second photochromic material comprises a compound represented by Formula 6 below:

[Formula 5]

[Formula 6]

9. The organic light-emitting display device of claim 1, wherein a ratio of the first photochromic material and the second photochromic material is a molar ratio of 1:2 to 2:1.

10. The organic light-emitting display device of claim 1, wherein the filler further comprises a binder.

11. The organic light-emitting display device of claim 1, wherein the filler further comprises an epoxy binder.

12. The organic light-emitting display device of claim 1, wherein an amount of the photochromic material of the filler is in the range of about 50 to about 70 parts by weight based on 100 parts by weight of the filler.

13. An organic light-emitting display device comprising:

a first substrate;

a second substrate disposed to face the first substrate;

a display unit interposed between the first substrate and the second substrate and comprising an organic light-emitting device;

a sealing member disposed to surround the display unit between the first substrate and the second substrate and that bonds the first substrate to the second substrate; and a filler disposed in a space defined by the first and second substrates and the sealing member to cover the display unit, the filler comprising:

a first photochromic material comprising a compound absorbing light in a wavelength of about 470 nm to about 490 nm and represented by Formula 1; and a second photochromic material absorbing light in a wavelength of about 550 nm to about 580 nm and represented by Formula 1:

[Formula 1]

wherein $R_1$, $R_2$, $R_3$, $R_4$, $R_5$, and $R_6$ are each independently hydrogen, heavy hydrogen, or halogen, and $Ar_1$ and $Ar_2$ are each independently a group below;

Y represents O, S, SO, or $SO_2$;

X represents C or N;

* represents a bond;

$R_8$ represents a $C_1$ to $C_{50}$ alkyl group or a $C_5$ to $C_{60}$ aryl group; and $R_7$ and $R_9$ are each independently an unshared electron pair, hydrogen, heavy hydrogen, or a $C_1$ to $C_{50}$ alkyl group;

wherein an amount of the photochromic material of the filler is in the range of about 50 to about 70 parts by weight based on 100 parts by weight of the filler.

14. The organic light-emitting display device of claim 13, wherein each of the first and second photochromic material comprises independently a compound represented by Formula 2 below:

[Formula 2]

wherein $R_1$, $R_2$, $R_3$, $R_4$, $R_5$, and $R_6$ are each independently hydrogen, heavy hydrogen, or halogen,

X represents C or N;

$R_8$ represents a $C_1$ to $C_{10}$ alkyl group or a $C_6$ to $C_{30}$ aryl group; and

$R_7$ and $R_9$ are each independently an unshared electron pair, hydrogen, heavy hydrogen, or a $C_1$ to $C_{10}$ alkyl group.

15. The organic light-emitting display device of claim 13, wherein the first photochromic material comprises a compound represented by Formula 3 below; and the second photochromic material comprises a compound represented by Formula 4 below:

[Formula 3]

[Formula 4]

in the above Formulae, $R_8$ represents a $C_1$ to $C_{10}$ alkyl group or a $C_5$ to $C_{30}$ aryl group; and $R_9$ represents hydrogen, heavy hydrogen, or a $C_1$ to $C_{10}$ alkyl group.

16. The organic light-emitting display device of claim 13, wherein the first photochromic material comprises a compound represented by Formula 5 below; and the second photochromic material comprises a compound represented by Formula 6 below:

[Formula 5]

[Formula 6]

17. The organic light-emitting display device of claim 13, wherein a ratio of the first photochromic material and the second photochromic material is a molar ratio of 1:2 to 2:1.

18. The organic light-emitting display device of claim 13, wherein the filler further comprises a binder.

19. The organic light-emitting display device of claim 13, wherein the filler further comprises an epoxy binder.

* * * * *